(12) United States Patent
Sewell et al.

(10) Patent No.: US 8,089,609 B2
(45) Date of Patent: Jan. 3, 2012

(54) LITHOGRAPHIC APPARATUS AND DEVICE MANUFACTURING METHOD

(75) Inventors: Harry Sewell, Ridgefield, CT (US); Justin L. Kreuzer, Trumbull, CT (US)

(73) Assignee: ASML Holding N.V., Veldhoven (NL)

( * ) Notice: Subject to any disclaimer, the term of this patent is extended or adjusted under 35 U.S.C. 154(b) by 603 days.

(21) Appl. No.: 12/232,902

(22) Filed: Sep. 25, 2008

(65) Prior Publication Data
US 2009/0109412 A1    Apr. 30, 2009

Related U.S. Application Data

(60) Provisional application No. 60/960,404, filed on Sep. 28, 2007.

(51) Int. Cl.
*G03B 27/52* (2006.01)
(52) U.S. Cl. .......................... 355/30; 356/517
(58) Field of Classification Search ............. 355/30, 355/53, 55; 356/28.5, 450, 491, 517, 520
See application file for complete search history.

(56) References Cited

U.S. PATENT DOCUMENTS

| | | | | |
|---|---|---|---|---|
| 4,930,894 A | * | 6/1990 | Baldwin | ................ 356/485 |
| 7,006,209 B2 | | 2/2006 | Levinson | |
| 7,616,290 B2 | | 11/2009 | Honda | |
| 7,643,129 B2 | | 1/2010 | Nagahashi | |
| 2005/0050941 A1 | * | 3/2005 | Sage et al. | ................ 73/1.16 |
| 2006/0139583 A1 | * | 6/2006 | Wegmann et al. | .......... 355/30 |
| 2006/0209280 A1 | | 9/2006 | Makita et al. | |
| 2006/0290912 A1 | * | 12/2006 | Kishikawa | ................ 355/53 |
| 2007/0070316 A1 | * | 3/2007 | Ehrmann et al. | .......... 355/53 |

FOREIGN PATENT DOCUMENTS

| | | |
|---|---|---|
| JP | 2000-249510 | 9/2000 |
| JP | 2004-125740 | 4/2004 |
| JP | 2006-261607 | 9/2006 |
| JP | 2006-319064 | 11/2006 |
| WO | 2005/038888 | 4/2005 |

OTHER PUBLICATIONS

Richerzhagen, Bernold, Interferometer for measuring the absolute refractive index of liquid water as a function of temperature at 1.064 um, Apr. 1, 1996, Applied Optic, vol. 35, No. 10.*
Japanese Office Action mailed Feb. 16, 2011 in corresponding Japanese Patent Application No. 2008-244433.

\* cited by examiner

*Primary Examiner* — Hung Henry Nguyen
*Assistant Examiner* — Steven H Whitesell Gordon
(74) *Attorney, Agent, or Firm* — Pillsbury Winthrop Shaw Pittman LLP

(57) ABSTRACT

A lithographic apparatus comprises an immersion fluid system and an interferometric temperature detection system. The immersion fluid system is configured to provide immersion fluid to an exposure system. The interferometric temperature detection system is configured to measure a temperature of the immersion fluid.

20 Claims, 11 Drawing Sheets

LITHOGRAPHIC APPARATUS AND DEVICE MANUFACTURING METHOD

FIELD

The present invention relates to immersion lithography. More particularly, the present invention relates to a system, method, and computer product to measure an immersion fluid temperature and compensate for changes in the immersion fluid temperature.

BACKGROUND

A lithographic apparatus is a machine that applies a desired pattern onto a substrate. The lithographic apparatus is used in manufacturing integrated circuits (ICs). A patterning device, which is alternatively referred to as a mask or a reticle, contains a circuit pattern to be formed on an individual layer of the IC. The circuit pattern is transferred onto a target portion of a silicon wafer substrate by illuminating the patterning device with radiation. The lithographic apparatus transfers the circuit pattern by exposing the image onto a layer of radiation-sensitive material (resist) on the wafer. It is also possible to transfer the pattern from the patterning device to the substrate by imprinting the pattern onto the substrate. In general, a single substrate contains an array of adjacent target portions that are successively patterned.

It has been proposed to immerse the substrate in an immersion fluid having a high refractive index relative to that of air, to fill a space between a final element of the projection system and the substrate. The point of this is to allow imaging of smaller features since the exposure radiation will have a shorter wavelength in the fluid. The effect of the immersion fluid may also be regarded as increasing both an effective numerical aperture (NA) of the system and depth of focus.

SUMMARY

A drawback of immersing the substrate in the immersion fluid during imaging is that the exposure radiation heats the immersion fluid. The heating effect on the immersion fluid is dependent upon the delivered radiation dose. As soon as the exposure energy is turned off, the heated immersion fluid is swept away by a continuous fluid flow. Thus, the combination of changes in radiation dose and continuous fluid flow causes changes in immersion fluid temperature. As immersion fluid temperature changes, the immersion fluid expands, resulting in a change in density of the immersion fluid. As the density of the immersion fluid changes, the index of refraction of the immersion fluid also changes, causing aberrations in the image field, such as defocus. When the immersion fluid is water, the refractive index of the immersion fluid changes greatly for a comparatively small change in immersion fluid temperature. Traditional aberration control systems do not respond quickly enough to compensate for aberrations caused by changes in immersion fluid temperature due to radiation dose and continuous immersion fluid flow.

An additional or alternative problem with conventional aberration control systems is inaccuracy of immersion fluid temperature measurement. Traditional immersion fluid temperature control systems measure immersion fluid temperature with a thermistor. A thermistor provides a temperature signal as feedback to an aberration control system that controls a heater element. The heater element adjusts the immersion fluid temperature. Unfortunately, the thermistor only has an accuracy of ±5 mK. Thus, an inaccurate temperature measurement may lead to a slow response time of the aberration control system, which may cause inadequate compensation for changes in immersion fluid temperature. The inadequate temperature compensation results in an unnecessary constraint on minimum feature size.

A system, method, and computer product are provided that more effectively control immersion fluid temperature.

In an embodiment, there is provided a lithographic apparatus comprising an immersion fluid system and an interferometric temperature detection system. The immersion fluid system is configured to provide immersion fluid to an exposure system. The interferometric temperature detection system is configured to measure a temperature of the immersion fluid.

Further embodiments, features, and advantages, as well as the structure and operation of the various embodiments, are described in detail below with reference to the accompanying drawings.

BRIEF DESCRIPTION OF THE DRAWINGS/FIGURES

The accompanying drawings, which are incorporated herein and form a part of the specification, illustrate one or more embodiments and, together with the description, further serve to explain the principles of the invention and to enable a person skilled in the pertinent art to make and use the invention.

Figure 1A:
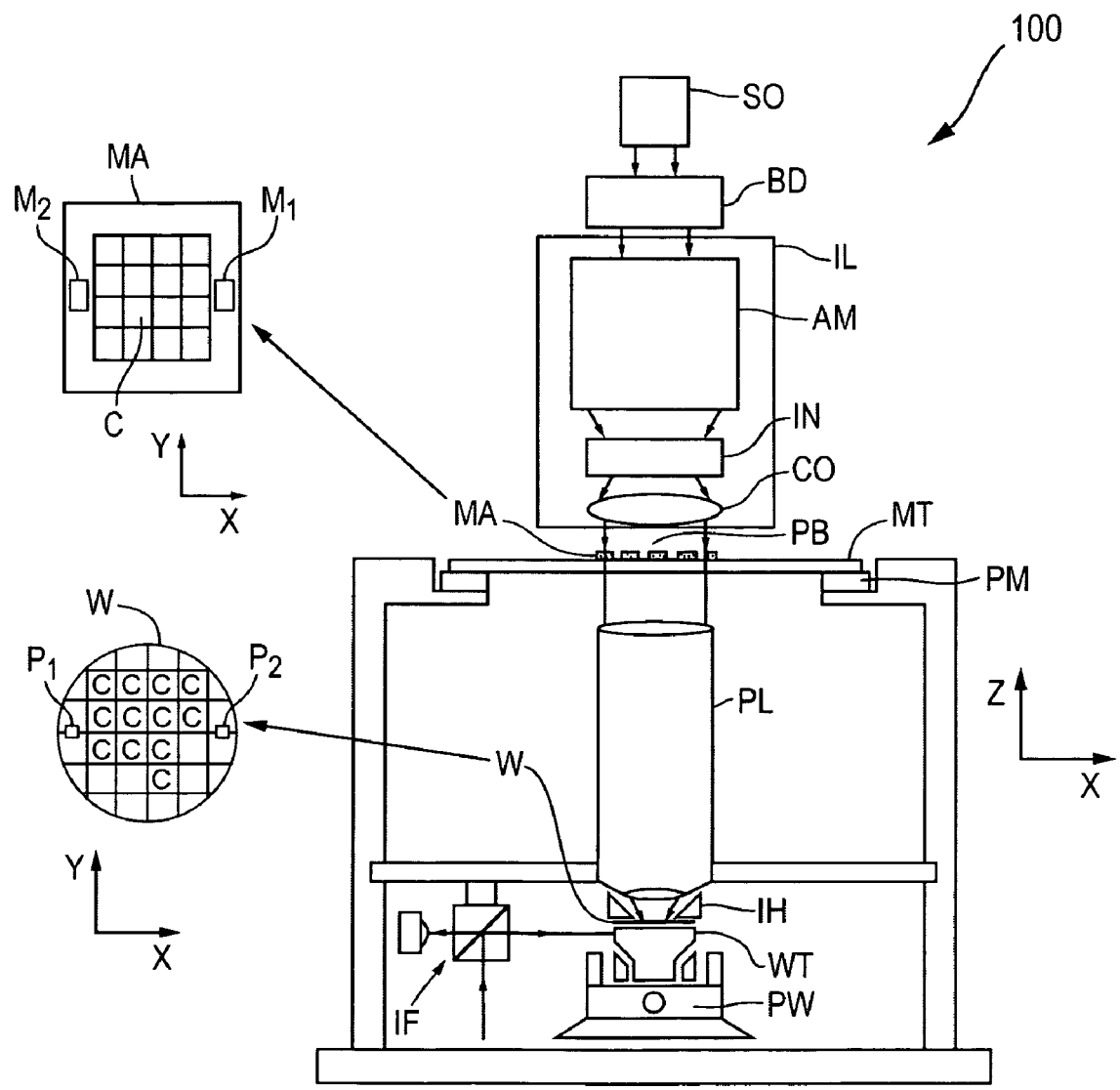
FIG. 1A depicts an exemplary lithography apparatus.

Embodiment of the present invention will now be described with reference to the accompanying drawings. In the drawings, like reference numbers may indicate identical or functionally similar elements. Additionally, the left-most digit(s) of a reference number may identify the drawing in which the reference number first appears.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment," "an embodiment," "an example embodiment," etc., indicate that the embodiment(s) described can include a particular feature, structure, or characteristic, but every embodiment cannot necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention can be implemented in hardware, firmware, software, or any combination thereof. Embodiments of the invention can also be implemented as instructions stored on a machine-readable medium, which can be read and executed by one or more processors. A machine-readable medium can include any mechanism for storing or transmitting information in a form readable by a machine (e.g., a computing device). For example, a machine-readable medium can include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions can be described herein as performing certain actions. However, it should be appreciated that such descriptions are merely for convenience and that such actions in fact result from computing devices, processors, controllers, or other devices executing the firmware, software, routines, instructions, etc.

Although specific reference may be made to use of a lithographic apparatus in manufacturing a specific device (e.g., an integrated circuit or a flat panel display), it should be understood that the lithographic apparatus described herein may have other applications. Applications include, but are not limited to, manufacturing a semiconductor device, an integrated circuit, an integrated optical system, a guidance and detection pattern for a magnetic domain memory, a flat-panel display, a liquid-crystal display (LCDs), a thin-film magnetic head, a micro-electromechanical device (MEMS), etc. Also, for example in a flat panel display, the lithographic apparatus may be used to assist in creating of a variety of layers (e.g. a thin film transistor layer and/or a color filter layer). A skilled artisan will appreciate that, in the context of such alternative applications, any use of the terms "wafer" or "die" herein may be considered as synonymous with the more general terms "substrate" or "target portion", respectively. Further, the substrate may be processed more than once, for example in order to create a multi-layer IC, so that the term substrate used herein may also refer to a substrate that already contains multiple processed layers.

An embodiment may be applied to any immersion lithography apparatus, such as, but not exclusively, those types mentioned herein. An immersion fluid may be provided in the form of a bath or only on a localized surface of the substrate. An immersion fluid system as contemplated herein should be broadly construed. In an embodiment, the immersion fluid supply system may be a mechanism or combination of structures that provides a fluid to a cavity defined by a projection system and a substrate and/or a substrate table. The immersion fluid supply system may comprise a combination of one or more structures, one or more fluid inlets, one or more gas inlets, one or more gas outlets, and/or one or more fluid outlets that provide the fluid to the space. In an embodiment, a surface of the cavity may be a portion of the substrate and/or the substrate table. In a further embodiment, a surface of the cavity may completely cover a surface of the substrate and/or the substrate table. In another embodiment, a surface of the cavity may space may envelop the substrate and/or substrate table. The immersion fluid supply system may optionally include an apparatus to control features of the fluid including, and not limited to, a position, quantity, quality, shape, flow rate, temperature and/or other fluid characteristic.

The immersion fluid used in the immersion fluid system may have different compositions, according to properties and a wavelength of exposure radiation used. As an example, for an exposure wavelength of 193 nm, ultra pure water or a water-based composition may be used as the immersion fluid. For this reason, the immersion fluid is sometimes referred to as water. Water-related terms such as hydrophilic, hydrophobic, humidity, etc. may be used when describing the immersion fluid.

Figure 1B:
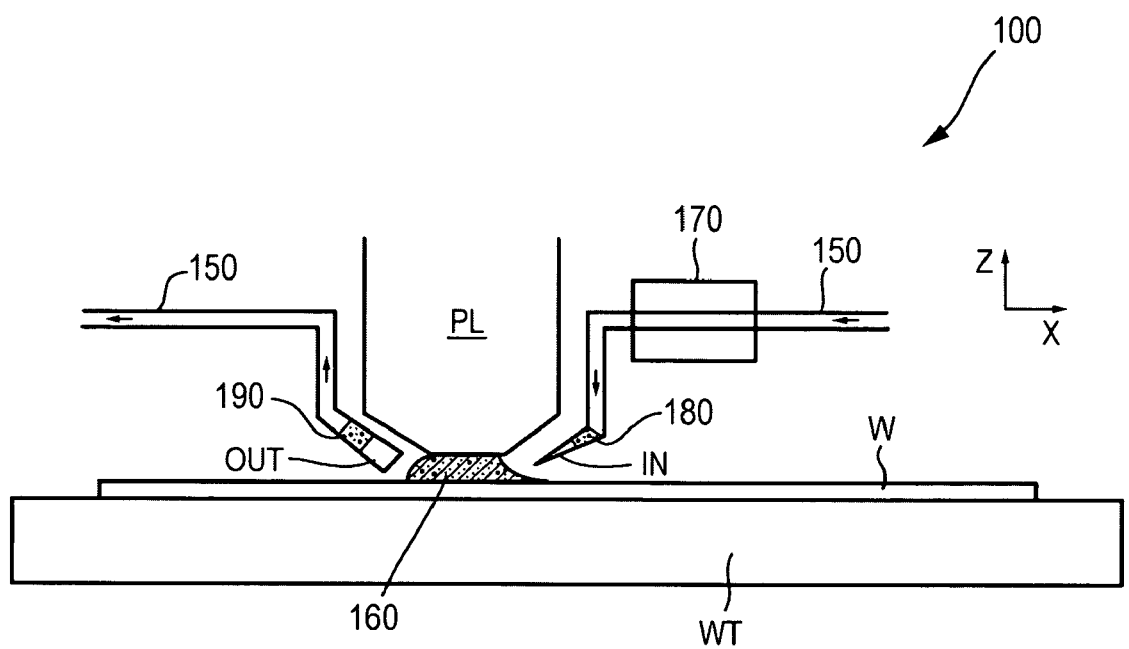
FIG. 1B illustrates the exemplary lithography apparatus with a localized fluid supply system.

FIGS. 1A and 1B depict an exemplary lithography apparatus 100, also known as an immersion lithography exposure system. The lithography apparatus 100 includes an immersion fluid system. The immersion fluid system is configured to provide immersion fluid to the immersion lithography exposure system. Further, the immersion fluid system is also configured to remove immersion fluid from the immersion lithography exposure system. The lithography apparatus 100 also includes an interferometric temperature detection system (e.g., see system 300 in FIG. 3A) that is configured to measure a temperature of the immersion fluid. The lithography apparatus 100 is now described in detail.

As illustrated in FIGS. 1A and 1B, the lithography apparatus 100 comprises an illumination system (e.g., an illuminator) IL configured to condition a radiation beam PB (e.g. UV radiation or DUV radiation). There is also a support structure (e.g., a mask table) MT constructed to support a patterning device (e.g., a mask or array of individually controllable elements) MA. The support structure (e.g., a mask table) MT is connected to a first positioner PM configured to accurately position the patterning device. A substrate table (e.g., a wafer or substrate table) WT is configured to hold a substrate (e.g. a resist-coated wafer or flat panel display substrate) W and is connected to a second positioner PW configured to accurately position the substrate. A projection system (e.g., a refractive projection lens system) PL is configured to project a pattern imparted to the radiation beam PB by a patterning device MA onto a target portion C (e.g., comprising one or more dies) of the substrate W.

The lithography apparatus 100 may include various types of optical components, such as refractive, reflective, magnetic, electromagnetic, electrostatic or other types of optical components, or any combination thereof, for directing, shaping, or controlling the radiation beam PB.

The support structure MT holds the patterning device MA in a manner that depends on an orientation of the patterning device MA, the design of the lithography apparatus 100, and other conditions, such as for example whether or not the patterning device MA is held in a vacuum environment. The support structure MT may use mechanical, vacuum, electrostatic or other clamping techniques to hold the patterning device MA. The support structure MT may be a frame or a table, for example, which may be fixed or movable. The support structure MT may ensure that the patterning device MA is at a specific position, for example a position respective to the projection system PL.

The term "patterning device" as used herein should be broadly interpreted as referring to any device that may be used to impart a radiation beam PB with a pattern in its cross-section, such as to create a pattern in a target portion C of the substrate W. It should be noted that the pattern imparted to the radiation beam PB may not exactly correspond to the desired pattern in the target portion C of the substrate W, for example if the pattern includes phase-shifting features or assist features. Generally, the pattern created on the target portion C of the substrate W will correspond to a particular functional layer in a device being created in the target portion C, such as an integrated circuit or a flat panel display (e.g., a color filter layer in a flat panel display or a thin film transistor layer in a flat panel display).

The patterning device MA may be transmissive or reflective. Examples of such patterning devices include reticles, programmable mirror arrays, laser diode arrays, light emitting diode arrays, grating light valves, and LCD arrays. Masks are well known in lithography, and include mask types such as binary, alternating phase-shift, and attenuated phase-shift, as well as various hybrid mask types. An example of a programmable mirror array employs a matrix arrangement of small mirrors, each of which may be individually tilted, so as to reflect a part of an incoming radiation beam in different directions. The tilted mirrors impart a pattern in a radiation beam, which is reflected by the mirror matrix.

The lithography apparatus 100 may be of a type having two (dual stage) or more of the substrate tables WT and/or two or more of the support structures MT. In such "multiple stage" machines, the additional tables WT or the support structures MT may be used in parallel, or preparatory steps may be carried out on one or more tables WT or the support structures MT while one or more other tables WT or support structures MT are being used for exposure.

Referring to FIG. 1A, the illuminator IL receives the radiation beam PB from the radiation source SO. The source SO and the lithography apparatus 100 may be separate apparatus, for example when the source SO is an excimer laser. In such cases, the source SO is not considered to form part of the lithography apparatus 100 and the radiation beam is passed from the source SO to the illuminator IL with the aid of a beam delivery system BD comprising, for example, suitable directing mirrors and/or a beam expander. In other cases, the source SO may be an integral part of the lithography apparatus 100, for example when the source SO is a mercury lamp. The source SO and the illuminator IL, together with the beam delivery system BD if required, may be referred to as a radiation system.

The illuminator IL may comprise an adjuster AM for adjusting an angular intensity distribution of the radiation beam PB. Generally, at least the outer and/or inner radial extent (commonly referred to as σ-outer and σ-inner, respectively) of the intensity distribution in a pupil plane of the illuminator IL may be adjusted. In addition, the illuminator IL may comprise various other components, such as an integrator IN and a condenser CO. The illuminator IL may be used to condition a cross-section of the radiation beam PB to a uniform intensity distribution.

The radiation beam PB is incident on the patterning device (e.g., mask) MA, which is held on the support structure (e.g., mask table) MT, and is patterned by the patterning device MA. Having traversed the patterning device MA, the radiation beam PB passes through the projection system PL, which focuses the beam onto a target portion C of the substrate W. An immersion hood IH, which is described further herein, supplies an immersion fluid 160 from the immersion fluid system to a cavity defined by the final element of the projection system PL and the substrate W.

With aid of a second positioner PW and a position sensor IF (e.g., an interferometric device, linear encoder or capacitive sensor), the substrate table WT may be moved accurately (e.g., to position different target portions C in a path of the radiation beam PB). Similarly, a first positioner PM and another position sensor (which is not explicitly depicted in FIG. 1A) may be used to accurately position the patterning device MA with respect to the path of the radiation beam PB (e.g., after mechanical retrieval from a mask library, and/or during a scan). In general, movement of the support structure MT may be realized with aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner), the support structure MT may be connected to a short-stroke actuator only, or may be fixed. The patterning device MA and the substrate W may be aligned using patterning device alignment marks M1, M2 and substrate alignment marks P1, P2. Although the substrate alignment marks P1, P2 as illustrated occupy dedicated target portions, the substrate alignment marks P1, P2 may be located in spaces between target portions (these also are known as scribe-lane alignment marks). Similarly, in situations in which more than one die is provided on the patterning device MA, the patterning device alignment marks M1, M2 may be located between the target portions C (e.g., dies).

Patterning devices MA whose pattern is programmable with the aid of electronic means (e.g., a computer), such as patterning devices comprising a plurality of programmable elements (e.g., all the devices mentioned in the previous sentence except for the reticle), are collectively referred to herein as "contrast devices." The patterning device MA comprises at least 10, at least 100, at least 1,000, at least 10,000, at least 100,000, at least 1,000,000, or at least 10,000,000 programmable elements.

A programmable mirror array can comprise a matrix-addressable surface having a viscoelastic control layer and a reflective surface. The basic principle behind such an apparatus is that addressed areas of the reflective surface reflect incident light as diffracted light, whereas unaddressed areas reflect incident light as undiffracted light. Using an appropriate spatial filter, the undiffracted light can be filtered out of the reflected beam, leaving only the diffracted light to reach the substrate W. In this manner, the beam PB becomes patterned according to the addressing pattern of the matrix-addressable surface.

It will be appreciated that, as an alternative, the filter can filter out the diffracted light, leaving the undiffracted light to reach the substrate W.

An array of diffractive optical MEMS devices (micro-electro-mechanical system devices) can also be used in a corresponding manner. In one example, a diffractive optical MEMS device is composed of a plurality of reflective ribbons that can be deformed relative to one another to form a grating that reflects incident light as diffracted light.

A further alternative example of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors reflect an incoming radiation beam PB in a different direction than unaddressed mirrors; in this manner, the reflected beam can be patterned according to the addressing pattern of the matrix-addressable mirrors. The required matrix addressing can be performed using suitable electronic means.

Another example patterning device is a programmable LCD array.

The lithographic apparatus 100 may comprise one or more contrast devices. For example, it can have a plurality of arrays of individually controllable elements, each controlled independently of each other. In such an arrangement, some or all of the arrays of individually controllable elements can have at least one of a common illumination system (or part of an illumination system), a common support structure for the arrays of individually controllable elements, and/or a common projection system (or part of the projection system).

In one example, such as the embodiment depicted in FIG. 1, the substrate W has a substantially circular shape, optionally with a notch and/or a flattened edge along part of its perimeter. In another example, the substrate W has a polygonal shape, e.g., a rectangular shape.

Examples where the substrate W has a substantially circular shape include examples where the substrate has a diameter of at least 25 mm, at least 50 mm, at least 75 mm, at least 100 mm, at least 125 mm, at least 150 mm, at least 175 mm, at least 200 mm, at least 250 mm, or at least 300 mm. Alternatively, the substrate has a diameter of at most 500 mm, at most 400 mm, at most 350 mm, at most 300 mm, at most 250 mm, at most 200 mm, at most 150 mm, at most 100 mm, or at most 75 mm.

Examples where the substrate is polygonal, e.g., rectangular, include examples where at least one side, at least 2 sides or at least 3 sides, of the substrate has a length of at least 5 cm, at least 25 cm, at least 50 cm, at least 100 cm, at least 150 cm, at least 200 cm, or at least 250 cm. At least one side of the substrate W has a length of at most 1000 cm, at most 750 cm, at most 500 cm, at most 350 cm, at most 250 cm, at most 150 cm, or at most 75 cm.

In one example, the substrate W is a wafer, for instance a semiconductor wafer. The wafer material can be selected from the group consisting of Si, SiGe, SiGeC, SiC, Ge, GaAs, InP, and InAs. The wafer can be: a III/V compound semiconductor wafer, a silicon wafer, a ceramic substrate, a glass substrate, or a plastic substrate. The substrate W can be transparent (for the naked human eye), colored, or absent a color.

The thickness of the substrate W can vary and, to an extent, can depend on the substrate material and/or the substrate dimensions. The thickness can be at least 50 µm, at least 100 µm, at least 200 µm, at least 300 µm, at least 400 µm, at least 500 µm, or at least 600 µm. Alternatively, the thickness of the substrate W can be at most 5000 µm, at most 3500 µm, at most 2500 µm, at most 1750 µm, at most 1250 µm, at most 1000 µm, at most 800 µm, at most 600 µm, at most 500 µm, at most 400 µm, or at most 300 µm.

The substrate W referred to herein can be processed, before or after exposure, in for example a track (a tool that typically applies a layer of resist to a substrate W and develops the exposed resist), a metrology tool, and/or an inspection tool. In one example, a resist layer is provided on the substrate W.

The projection system PL can image the pattern on the array of individually controllable elements, such that the pattern is coherently formed on the substrate W. Alternatively, the projection system PL can image secondary sources for which the elements of the array of individually controllable elements act as shutters. In this respect, the projection system PL can comprise an array of focusing elements such as a micro lens array (known as an MLA) or a Fresnel lens array to form the secondary sources and to image spots onto the substrate W. The array of focusing elements (e.g., MLA) comprises at least 10 focus elements, at least 100 focus elements, at least 1,000 focus elements, at least 10,000 focus elements, at least 100,000 focus elements, or at least 1,000,000 focus elements.

The number of individually controllable elements in the patterning device MA is equal to or greater than the number of focusing elements in the array of focusing elements. One or more (e.g., 1,000 or more, the majority, or each) of the focusing elements in the array of focusing elements can be optically associated with one or more of the individually controllable elements in the array of individually controllable elements, with 2 or more, 3 or more, 5 or more, 10 or more, 20 or more, 25 or more, 35 or more, or 50 or more of the individually controllable elements in the array of individually controllable elements.

The MLA can be movable (e.g., with the use of one or more actuators) at least in the direction to and away from the substrate W. Being able to move the MLA to and away from the substrate W allows, e.g., for focus adjustment without having to move the substrate W.

Referring again to FIG. 1, the illuminator IL receives the radiation beam PB from a radiation source SO. The radiation source SO provides radiation having a wavelength of at least 5 nm, at least 10 nm, at least 11-13 nm, at least 50 nm, at least 100 nm, at least 150 nm, at least 175 nm, at least 200 nm, at least 250 nm, at least 275 nm, at least 300 nm, at least 325 nm, at least 350 nm, or at least 360 nm. Alternatively, the radiation provided by radiation source SO has a wavelength of at most 450 nm, at most 425 nm, at most 375 nm, at most 360 nm, at most 325 nm, at most 275 nm, at most 250 nm, at most 225 nm, at most 200 nm, or at most 175 nm. The radiation can have a wavelength including 436 nm, 405 nm, 365 nm, 355 nm, 248 nm, 193 nm, 157 nm, and/or 126 nm.

The lithography apparatus 100 may be used in at least one of the following modes:

1. In step mode, the support structure MT and the substrate table WT are kept essentially stationary, while an entire pattern imparted to the radiation beam PB is projected onto a target portion C at one time (i.e. a single static exposure). The substrate table WT is then shifted in the X and/or Y direction so that a different target portion C may be exposed. In the step mode, a maximum size of an exposure field limits a size of the target portion C imaged in a single static exposure.

2. In scan mode, the support structure MT and the substrate table WT are scanned synchronously while a pattern C imparted to the radiation beam PB is projected onto a target portion C (i.e. a single dynamic exposure). The velocity and direction of the substrate table WT relative to the support structure MT may be determined by (de-)magnification and image reversal characteristics of the projection system PL. In the scan mode, a maximum size of an exposure field limits a width (in the non-scanning direction) of a target portion C in a single dynamic exposure, whereas a length of the scanning motion determines a height (in the scanning direction) of the target portion C.

3. In another mode, the support structure MT is kept essentially stationary while holding a programmable patterning device, and the substrate table WT is moved or scanned while a pattern imparted to the radiation beam PB is projected onto the target portion C. In this mode, the source SO is a pulsed radiation source and the programmable patterning device is updated as required after each movement of the substrate table WT or in between successive radiation pulses during a scan. This mode of operation may be readily applied to maskless lithography that utilizes programmable patterning device, such as a programmable mirror array of a type as referred to herein. Combinations and/or variations on the modes of use described herein or entirely different modes of use may also be employed.

FIG. 1B illustrates the lithography apparatus 100 with a localized fluid supply system 150 that supplies the immersion fluid 160 via an inlet IN. The inlet IN may be a final lens element showerhead and may be located on a side of the projection system PL. The immersion fluid 160 is removed by an outlet OUT. The lithography apparatus 100 includes an interferometric temperature sensor 180 that is configured to measure a temperature of the immersion fluid 160. In an example, the interferometric temperature sensor 180 is located as close as possible to the inlet IN. In a further example, the interferometric temperature sensor 180 is located to measure a temperature of the immersion fluid 160 in a cavity defined by the final element of the projection system PL and the substrate table WT. The interferometric temperature sensor 180 may provide area temperature mapping, as opposed to single point temperature measurement, such as that provided by a thermistor. Temperature mapping provides data that may be used to confirm temperature simulation results as well as for optimizing showerhead design and/or lens design.

In a further example, the lithography apparatus 100 also includes a second interferometric temperature sensor 190 that is configured to measure a temperature of the immersion fluid 160 output from the outlet OUT. The second interferometric temperature sensor 190 measures a temperature of the immersion fluid 160 that may be used to determine a heat load imposed on the immersion fluid 160 by the beam PB. A determination of the heat load may be used as a control signal to actuate an apparatus that controls a flow rate and/or heat polishing of the immersion fluid 160. In another example, an interferometer, such as those described herein, may be configured to measure the temperature of the immersion fluid 160 at any point where the immersion fluid 160 is present.

The localized fluid supply system 150 may contain a heat exchanger 170 in contact with the immersion fluid 160. The heat exchanger 170 is any apparatus capable of energy transfer to and/or from the immersion fluid 160. The heat exchanger 170 may add energy to the immersion fluid 160, thus increasing the temperature of the immersion fluid 160. Further or alternatively, the heat exchanger 170 may remove energy from the immersion fluid 160, thus decreasing the temperature of the immersion fluid 160. A quantity of energy transferred by the heat exchanger 170 is controllable. The quantity of energy transferred by the heat exchanger 170 may be controlled by a control circuit, such as a controller (e.g., see controller 420 in FIG. 4A). In an example, the heat exchanger 170 is a peltier device, also known as a thermoelectric module. The heat exchanger 170 may be of a liquid-to-liquid or a liquid-to-gas design. In an example, the heat exchanger 170 is located as close as possible to the inlet IN to minimize energy transfer between the immersion fluid 160 and the environment around the localized fluid supply system 150. In another example, the heat exchanger 170 may be configured to change the temperature of the immersion fluid 160 at any point where the immersion fluid 160 is present.

As part of a method to control a temperature of the immersion fluid 160, energy may be transferred to and/or from the immersion fluid 160 at any time. For example, the immersion fluid 160 may be cooled prior to entering the inlet IN. The heat exchanger 170 is integrated into the inlet IN and provides energy to the immersion fluid 160 to heat the immersion fluid 160. The energy provided by the integrated heat exchanger 170 is reduced during an exposure to control the temperature of the immersion fluid 160. Immersion fluid temperature control offsets an increased thermal load applied to the immersion fluid 160 by the radiation beam PB. Thus, in one example a location for control of the immersion fluid temperature is in the cavity defined by the final element of the projection system PL and the substrate table WT.

In an example, the substrate W is immersed in the immersion fluid 160 within the cavity defined by the final element of the projection system PL and the substrate table WT. In this example, the immersion fluid 160 is one having a relatively high refractive index, e.g., the immersion fluid may be water, that fills a space between the final element of the projection system PL and the substrate W. This allows for imaging of smaller features when the beam PB has a shorter wavelength in the immersion fluid 160. The effect of the immersion fluid 160 may also be regarded as allowing the numerical aperture (NA) of the system to be higher than 1, and increasing a depth of focus (DOF). Other immersion fluids have been proposed for use as the immersion fluid 160, including water with solid particles (e.g., quartz) suspended therein.

Figure 2A:
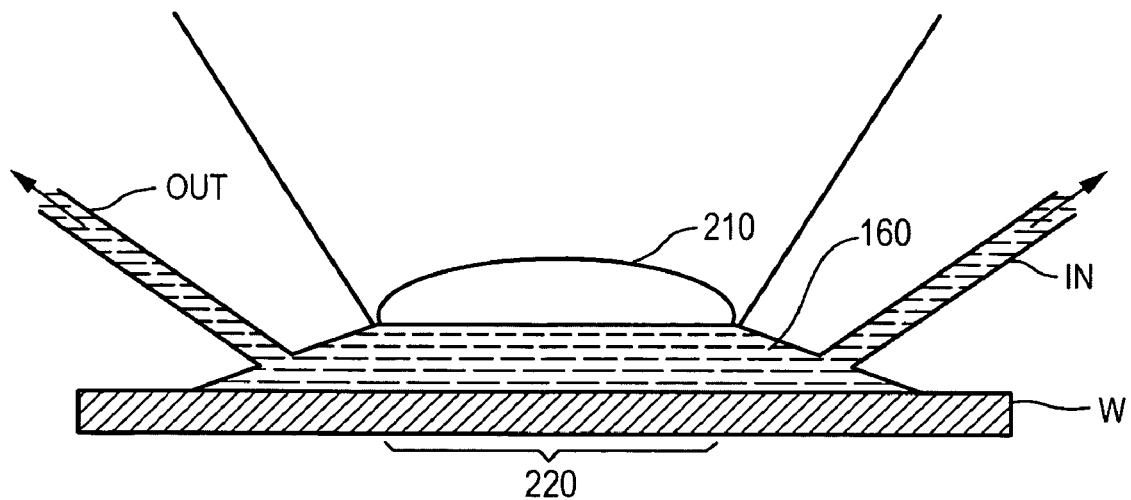
FIG. 2A is a diagram showing an exemplary flow of immersion fluid.
Figure 2B:
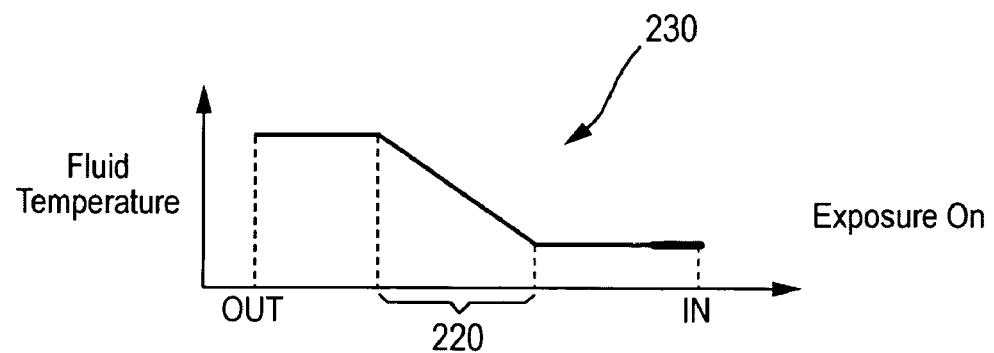
FIG. 2B is a graph illustrating an exemplary temperature effect resulting from exposure energy.
Figure 2C:
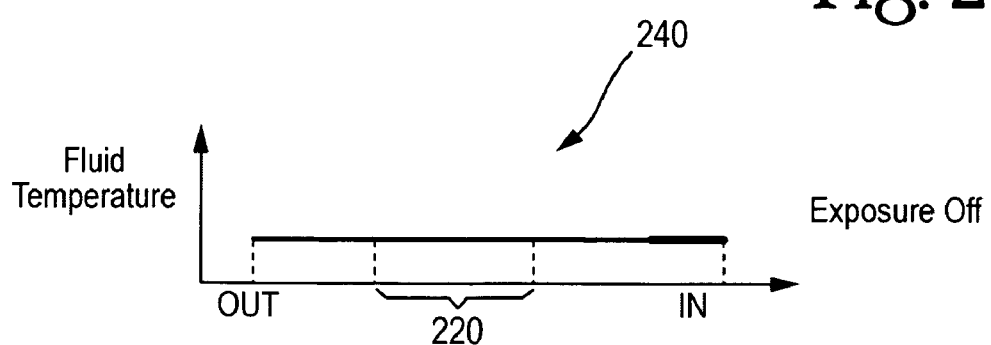
FIG. 2C is a graph illustrating an exemplary immersion fluid temperature in the absence of exposure energy.

FIGS. 2A-C are diagrams showing an exemplary flow of the immersion fluid 160 and an exemplary temperature effect resulting from exposure energy from the source SO. FIG. 2A includes a zoomed-in view of a region around an optical element 210 that is the final element of the projection system PL. The immersion lithography showerhead inlet IN drives the immersion fluid 160 into an exposure zone 220. The exposure zone 220 is an area of the substrate W that is patterned, and thus subject to exposure energy from the radiation beam PB. The immersion lithography showerhead outlet OUT removes the immersion fluid 160 from the exposure zone 220. In the lithography apparatus 100, the immersion lithography showerhead inlet IN and outlet OUT may be housed in an immersion lithography showerhead. The flow rate of the immersion fluid 160 may be controlled as a function of immersion fluid characteristic(s), for example to ensure that a minimum amount of turbulence is introduced in the immersion fluid 160 to avoid an optical impairment as the immersion fluid 160 flows through the exposure zone 220.

FIGS. 2B-C illustrate first and second plots 230 and 240, which show a steady state exposure temperature distribution of the immersion fluid 160 within the exposure zone 220. In FIG. 2B, the first plot 230 shows the temperature distribution when radiation from the beam PB projects through the immersion fluid 160. In FIG. 2C, the second plot 240 shows the temperature distribution when the source SO is off and no radiation from the beam PB projects through the immersion fluid 160. As can be seen when comparing these plots, a heating effect on the immersion fluid 160 is substantially instantaneous and dependent upon the delivered dose of radiation from the beam PB. As soon as the exposure energy is removed, the heated mass of the immersion fluid 160 is swept away by fluid flow. Thus, the flowing immersion fluid 160 induces a non-symmetric temperature distribution across the width of the exposure zone 220. The non-symmetric temperature distribution may induce aberrations in the image field. The aberrations, such as defocus, may change across the width of the image field.

The steady state exposure temperature distribution changes linearly across the width of the exposure zone 220, as shown in FIG. 2B. A magnitude of a temperature of the immersion fluid 160 changes (during exposure) from a nominal value at the upstream edge of the exposure zone 220. The magnitude of the immersion fluid temperature increases approximately linearly from the upstream edge of the exposure zone 220 to a downstream edge of the exposure zone 220. The temperature increase results from the immersion fluid 160 gaining energy from the radiation beam PB as it flows across the exposure zone 220. The magnitude of the temperature change on the downstream edge of the exposure zone 220 depends on, for example, the exposure dose, mask transparency, the fluid flow rate, and the absorption of exposure radiation by the immersion fluid 160.

An exemplary calculation of the heating effect is presented below. As an example, the source SO of the lithography apparatus 100 may produce ultra-violet radiation. In this case, power absorbed in the immersion fluid 160 may be determined through the following equation:

$$E_s = S*h*dx \quad (1)$$

where $E_s$ is the energy at the substrate W (e.g., a wafer), S is the sensitivity of the resist used on the substrate W, h is size of the exposure zone 220 along a direction perpendicular to the flow-direction and dx is an infinitesimal immersion fluid column width along a direction parallel to the flow-direction, and propagating across the exposure zone 220.

The power at the substrate is given by:

$$P_w = S*h*v \quad (2)$$

where $P_w$ is the power at the substrate W and v is the flow velocity. The power $P_f$ absorbed in the immersion fluid 160 is then given by:

$$P_f = S*h*v*\{1/(1-T)\} \quad (3)$$

where the transmission of the fluid layer is T. The mass flow rate $M_f$ of the immersion fluid 160 is given by:

$$M_f = \rho*R \quad (4)$$

where $\rho$ is the density of the immersion fluid 160 and R is the flow rate of the immersion fluid 160. The temperature change $\Delta T_f$ to the immersion fluid 160 then may be computed using equations (3) and (4) above as:

$$\Delta T_f = P_f/C_p*M_f \quad (5)$$

$$\Delta T_f = S*h*\{(1/(1-T))\}/C_p*\rho*R \quad (6)$$

where $C_p$ is the specific heat of the immersion fluid 160. As illustrated in FIG. 2B, the temperature of the immersion fluid 160 rises substantially linearly as it traverses the exposure zone 220. The magnitude of the temperature rise may be estimated by using illustrative values for an exemplary immersion lithography system arrangement. These values are intended to be illustrative, and not to limit the scope of the present invention. The exemplary values are as follows:

S=30 mJ/cm²
h=26 mm
v=500 mm/sec
$C_p$=1.78 KJ/Kg.K
$\rho$=880 Kg/m³
R=5 L/min
T=0.95 where mJ is millijoules and KJ is kilojoules. Substituting these values into equation (6), an exemplary $\Delta T_f$ is calculated to be 1.5 milliK. This represents a maximum temperature rise in the immersion fluid 160 as it is heated while crossing the exposure zone 220. The linear rise in temperature produces a change in optical path length as the refractive index of the immersion fluid 160 changes with temperature, which leads to aberrations if not corrected.

The optical path length difference (OPD) from one side of the exposure zone 220 at the inlet IN to the other side at the outlet OUT due to the heating effect of exposing ultra-violet radiation is given by:

$$OPD = n*C_t*TH_f*\Delta T_f \quad (7)$$

where n is a refractive index of the immersion fluid, $C_t$ is a temperature coefficient of the refractive index and $TH_f$ is a thickness of the immersion fluid 160.

The magnitude of the OPD may be estimated by using illustrative values for the immersion fluid 160. These values are intended to be illustrative, and not to limit the scope of the present invention. The exemplary values are as follows:

n=1.65 at a wavelength of 193 nm
$C_t$=-550×10⁻⁶
$TH_f$=3 mm

By substituting these values into equation (7), an exemplary OPD is calculated to be 1.36 nm. When the source SO has a wavelength of 193 nm, the OPD equates to a fraction 0.007 of a wavelength. This represents an estimate of the magnitude of the exposure dose and pattern density sensitive wavefront aberration due to the asymmetric heating of the immersion fluid 160 that assumes a 100% transparent reticle, which is to be compensated for in the optics wavefront. Thus, the OPD is affected by the transparency of the reticle, the fluid thickness, and the transparency of the immersion fluid 160. Therefore, to compensate for effects of radiation exposure on OPD, the temperature of the immersion fluid 160 supplied by the immersion lithography showerhead inlet IN is adjusted. The temperature adjustment may require an associated measurement of immersion fluid temperature that is more accurate that that provided by a thermistor.

Figure 3A:
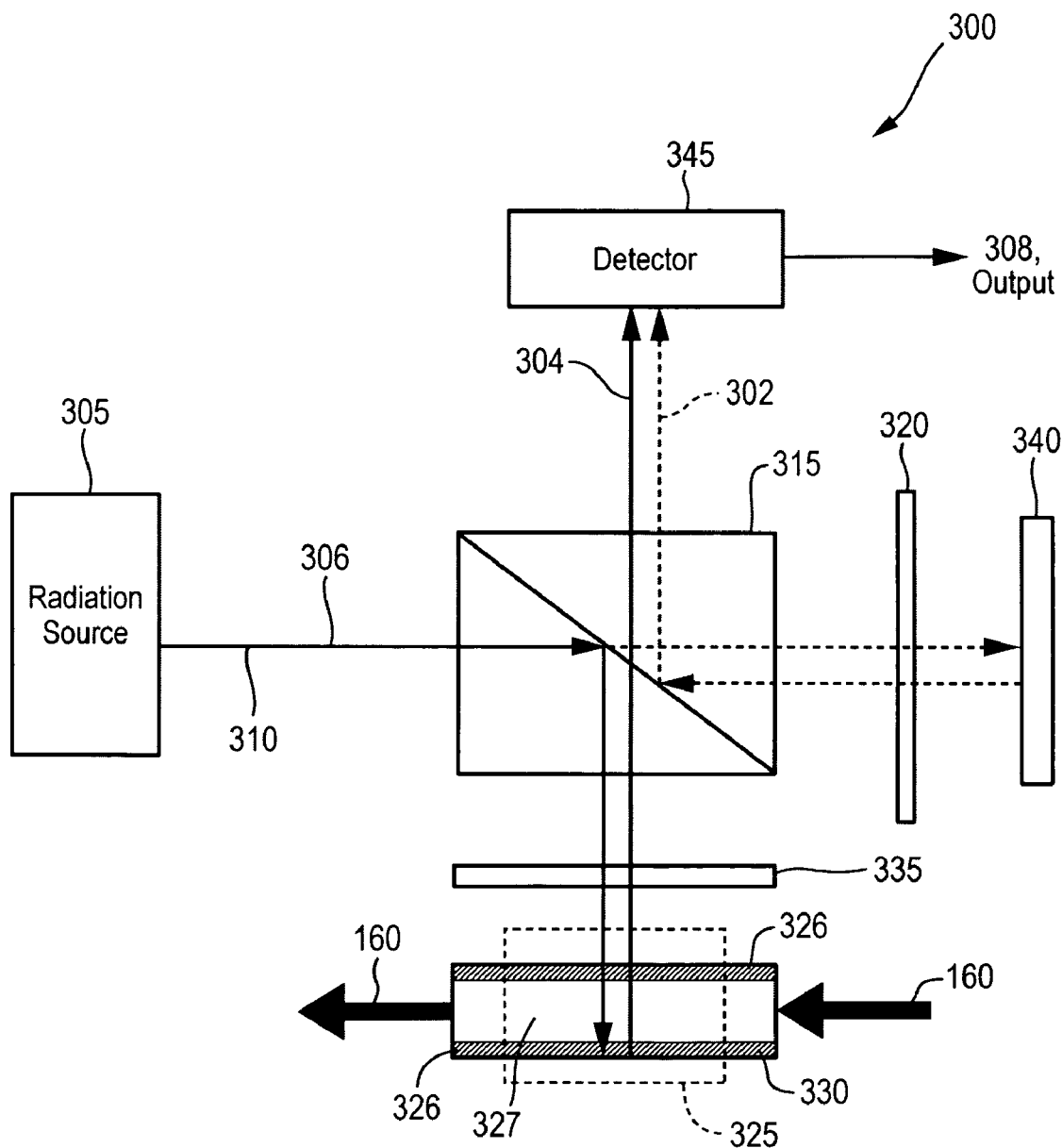
FIG. 3A illustrates an exemplary interferometric temperature detection system.

FIG. 3A illustrates an interferometric temperature detection system 300 that is configured to measure the temperature of the immersion fluid 160. In the example shown, interferometric temperature detection system 300 includes the following components: a radiation source 305 that is configured to produce a beam of radiation 310 that is coherent; a beamsplitter 315; a first polarizing element 320; a immersion fluid receptacle 325 having a reflective portion 330 that is configured to guide the immersion fluid 160; a second polarizing element 335; a reflective element 340; and a detector 345. The radiation source 305 produces the beam of radiation 310 that is coherent, and to which the immersion fluid 160 is transparent. In an example, the radiation source 305 produces a beam of radiation 310 that has a non-actinic wavelength to prevent activation of a resist layer on the substrate W. For example, the radiation source 305 produces a beam of radiation having a wavelength other than that of 193 nm.

The interferometric temperature detection system 300 measures a phase difference between first and second beams 302 and 304 of radiation to measure the temperature of the immersion fluid 160. A first beam of radiation 302 provides a reference phase. The second beam of radiation 304, also known as a metrology radiation beam, passes through the immersion fluid 160, which slows the second beam of radiation 304, thus altering a phase of the second beam of radiation 304 and imparting a metrology phase on the second beam of radiation 304. Changes in the temperature of the immersion fluid 160 alter the extent to which the immersion fluid 160 slows the second beam 304, which in turn varies the metrology phase of the second beam 304. A phase detector measures the phase difference between the reference phase of the first beam 302 and the metrology phase of second beam 304. The phase detector measures the phase difference after the second beam 304 has been transmitted through the immersion fluid 160.

In an example, the interferometric temperature sensor 180 comprises the interferometric temperature detection system 300. Alternatively, or additionally, the second interferometric temperature sensor 190 comprises the interferometric temperature detection system 300.

The beamsplitter 315 may be a polarizing beamsplitter, thus a first polarization state of an incident radiation beam 306 passes straight through the beamsplitter 315, while a second polarization state is reflected by the beamsplitter 315. A typical reflection of the second polarization state is by an angle of ninety degrees. In an example, the first polarization state is a p-polarization state and the second polarization state is an s-polarization state. In a further example, the first polarization state is an s-polarization state and the second polarization state is a p-polarization state. For example, this is done to generate first and second beams 302 and 304.

The first polarizing element 320 may be a quarter-wave plate or a three-quarter wave plate. The second polarizing element 335 may also be a quarter-wave plate or a three-quarter wave plate. The polarizing elements 320, 335 rotate a polarization of a beam transmitted through the respective polarizing element 320, 335 to route the beam through the beamsplitter 315.

The immersion fluid receptacle 325 may be integrated with the inlet IN. In an example, the immersion fluid receptacle 325 is an integral part of a structure in a cavity defined by the final element of the projection system PL and the substrate table WT. In another example, the immersion fluid receptacle 325 is an integral part of a structure that defines a cavity including the exposure zone 220. The immersion fluid receptacle 325 may be a part of a structure 326 that defines a cavity 327 configured to contain the immersion fluid 160. The reflective portion 330 may be a part of a structure that defines a cavity configured to contain the immersion fluid 160. As described in the example above, when immersion fluid flows through the immersion fluid receptacle 325, the temperature of the immersion fluid 160 changes a path length of a radiation beam passing through the immersion fluid receptacle 325.

The detector 345 detects a phase difference between an incident first radiation beam and an incident second radiation beam, such as a difference between a reference phase and a metrology phase. Sensitivity of the interferometric temperature detection system 300 may be changed by increasing a path length of the beam of radiation 310 through the immersion fluid 160. Sensitivity of the interferometric temperature detection system 300 may be changed by directing the beam of radiation 310 through multiple paths in the immersion fluid 160 through, for example, use of multiple reflective surfaces.

In an example, the components of the interferometric temperature detection system 300 are configured such that a first polarization state of the beam of radiation 310 transmits through the beamsplitter 315 and the first polarizing element 320 as first beam 302, which reflects from the reflective element 340 back through the first polarizing element 320 and the beamsplitter 315, and is received by the detector 345 as a reference phase. The components of the interferometric temperature detection system 300 are further configured such that a second polarization state of the beam of radiation 310 transmits through the beamsplitter 315 and the second polarizing element 335 as second beam 304, and the immersion fluid 160 to reflect from the reflective portion 330 of the immersion fluid receptacle 325 back through the second polarizing element 335 and the beamsplitter 315, and is received by the detector 345 as the metrology phase. The detector 345 determines a phase difference between the reference phase and the metrology phase. The detector 345 creates an output signal 308 based on the phase difference between the reference phase and the metrology phase. The detector output signal 308 may received by a control circuit (e.g., see fluid heating compensation circuit 360 in FIG. 3B and controller 420 in FIG. 4A). It is to be appreciated that in other examples, the components of the interferometric temperature detection system 300 are configured in a manner other than that described herein to measure a temperature of the immersion fluid 160. In further examples, the interferometric temperature system 300 may include an optical element in addition to those described here, such as and not limited to, a reflective element, a lens, a prism, a beamsplitter, a filter, a polarizing plate, etc. In FIG. 3A, transmitted and reflected beams are illustrated as being offset from each other only to ease illustration of component configuration and operation.

In an example, the immersion fluid 160 is a hydrocarbon fluid that has a high index of refraction (n>1) and a dn/dT of substantially −550 ppm/° C. For a 1 mK change in temperature of the immersion fluid 160, the refractive index of the immersion fluid would change 0.55 ppm. For a total path length through the fluid of 10 mm, the path length of the beam of radiation 310 will change by 5.5 nm. If the beam of radiation 310 has a wavelength of 193 nm, the portion of the beam of radiation 310 that has passed through the immersion fluid 160 would have a detectable phase change of approximately 28.5 milliwaves relative to the portion of the beam of radiation 310 that has not passed through the immersion fluid 160. Thus, the interferometric temperature detection system 300 detects the temperature of the immersion fluid 160 with accuracy greater than that of the conventional thermistor.

In a further example, the interferometric temperature sensor 180 and/or the interferometric temperature sensor 190 may include an image shearing interferometer or a phase-shifting interferometer. The image shearing interferometer may be used because image shearing interferometers are robust and self-calibrating. In a further example, the interferometric temperature sensor 180 and/or the interferometric temperature sensor 190 may determine radiation intensity patterns in the exposure zone 220 for various operating characteristics prior to patterning of the substrate W. The radiation intensity patterns may include interference fringes with a shape characteristic for an aberration.

Figure 3B:
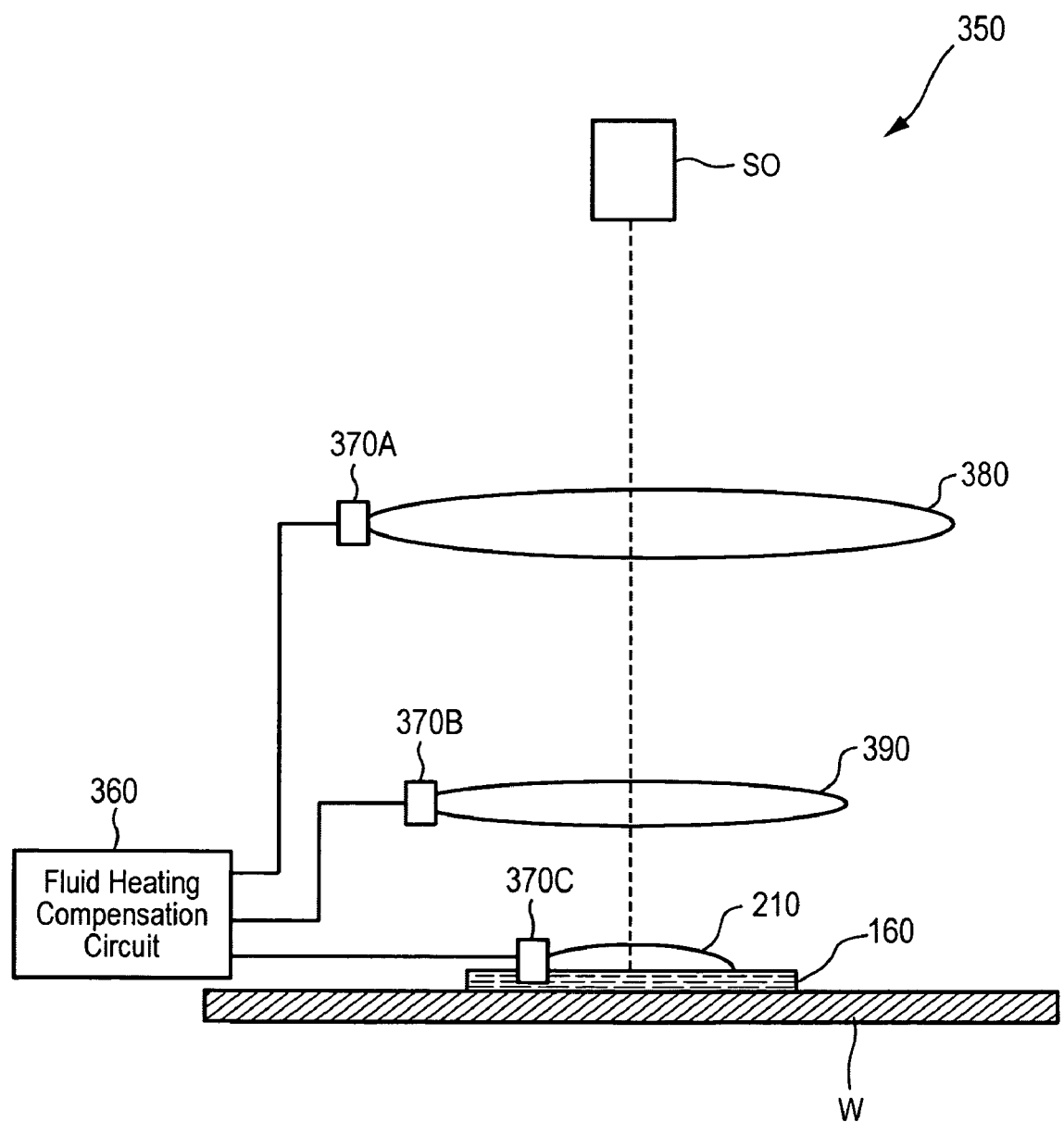
FIG. 3B is a block diagram of an exemplary aberration control system.

FIG. 3B is a block diagram of an exemplary aberration control system 350, which may be used to reduce an image aberration by adjusting an optical element based upon measuring a change in the immersion fluid temperature. The aberration control system 350 includes a fluid heating compensation circuit 360 and lens actuators 370A-C. Though three lens actuators 370 are illustrated in FIG. 3B, any number of lens actuators may be implemented. In an embodiment, the aberration control system 350 may also include an interferometric sensor, such as the interferometric temperature detection system 300 illustrated in FIG. 3A.

The actuators 370A-C are used to adjust optical elements 210, 380, 390 to correct an aberration. Specifically, the actuator 370A is coupled to an optical element 380, the actuator 370B is coupled to an optical element 390 and the actuator 370C is coupled to the optical element 210. The actuators 370A-C may be coupled to the fluid heating compensation circuit 360 either wirelessly or via a wired connection. A single actuator 370 is shown coupled to each optical element 210, 380, 390 for ease of illustration. This is not intended to limit the scope of the present invention. Multiple actuators 370 may be coupled to each optical element 210, 380, 390. Actuators 370 may not be coupled to all optical elements in the lithography apparatus 100. For example, in an embodiment one or more of the actuators 370 may be coupled to the optical element 210, as the last optical element in the projection system PL, without the actuators 370 coupled to any other optical element. The actuators 370 adjust the optical element that they are coupled to based on signals received from the fluid heating compensation circuit 360.

Additionally, or alternatively, the fluid heating compensation circuit 360 is coupled to the actuators 370A-C, and is coupled to a control system for the lithography apparatus 100 to receive inputs regarding flow rate, exposure on/off cycles, exposure dose, reticle pattern image, and the like. In an example, the fluid heating compensation circuit 360 is coupled to the detector 345. Characteristics of the immersion fluid 160 to be used, and other operating characteristics, may also be directly input into the fluid heating compensation circuit 360. The fluid heating compensation circuit 360 determines an actuator command to adjust an optical element within the lithography apparatus 100 based on changes in one or more of: a flow rate of the immersion fluid 160, an exposure dose, and a reticle pattern image. The fluid heating compensation circuit 360 may include a circuit or register or storage, also known as a map or lookup table, that assists the fluid heating compensation circuit 360 in determining an actuator command based upon a signal received from the detector 345, such that an image aberration in the lithography apparatus 100 due to a change in the temperature of the immersion fluid 160 is substantially eliminated and/or reduced.

In a further example, the detector 345 is coupled to provide a signal to an apparatus, such as a focus controller, configured to adjust an optical element in the lithography apparatus 100. The apparatus adjusts the optical element such that any image aberration in the lithography apparatus 100 caused by a change in the temperature of the immersion fluid 160 sensed by the interferometric temperature detection system 300 is substantially eliminated and/or reduced.

Figure 4A:
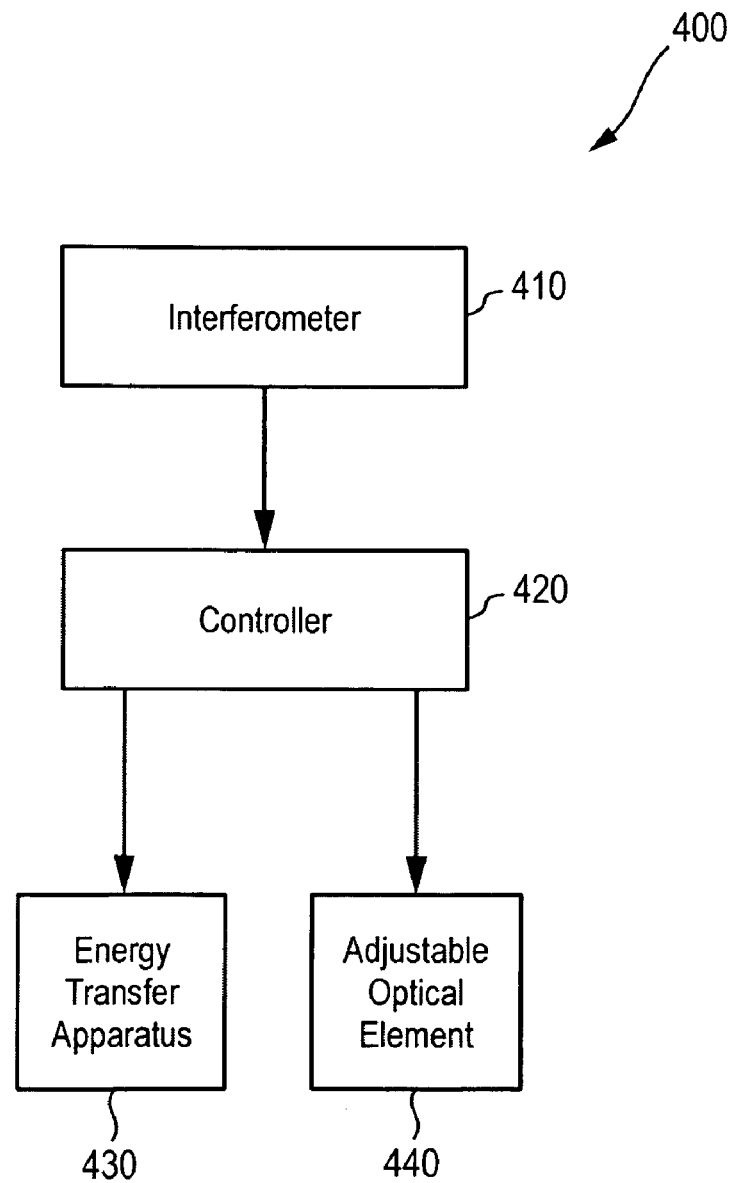
FIG. 4A is a block diagram of an exemplary temperature compensation system.

FIG. 4A is a block diagram of an exemplary temperature compensation system 400. The temperature compensation system 400 includes an interferometer 410, a controller 420, an optional energy transfer apparatus 430, and an optional adjustable optical element 440. For example, the interferometer 410 can comprise the interferometric temperature detection system 300, to measure a temperature of the immersion fluid 160. The interferometer sensor 410 creates a temperature signal that varies dependent upon a temperature of the immersion fluid 160. The interferometer is coupled to a controller 420, which uses the temperature signal at least in part, to determine a control signal. The controller 420 may include a circuit, such as a logic circuit, which assists the temperature compensation system 400 in determining a control signal based upon the temperature signal, such that any image aberration in the lithography apparatus 100 caused by a change in the temperature of the immersion fluid 160 that is sensed by the interferometer sensor 410 is substantially eliminated and/or reduced.

The controller 420 may optionally be coupled to an energy transfer apparatus 430, for example the heat exchanger 170. The controller 420 controls a quantity of energy transferred by the energy transfer apparatus 430 to or from the immersion fluid 160, such that any image aberration in the lithography apparatus 100 caused by a change in the temperature of the immersion fluid 160 that is sensed by the interferometer sensor 410 is substantially eliminated and/or reduced.

Further, the controller 420 may optionally be coupled to control an adjustable optical element 440, for example the optical element 210 via the lens actuator 370C. The controller 420 adjusts the adjustable optical element 440, such that an image aberration in the lithography apparatus 100 due to a change in the temperature of the immersion fluid 160 sensed by the interferometer sensor 410 is substantially eliminated and/or reduced.

Figure 4B:
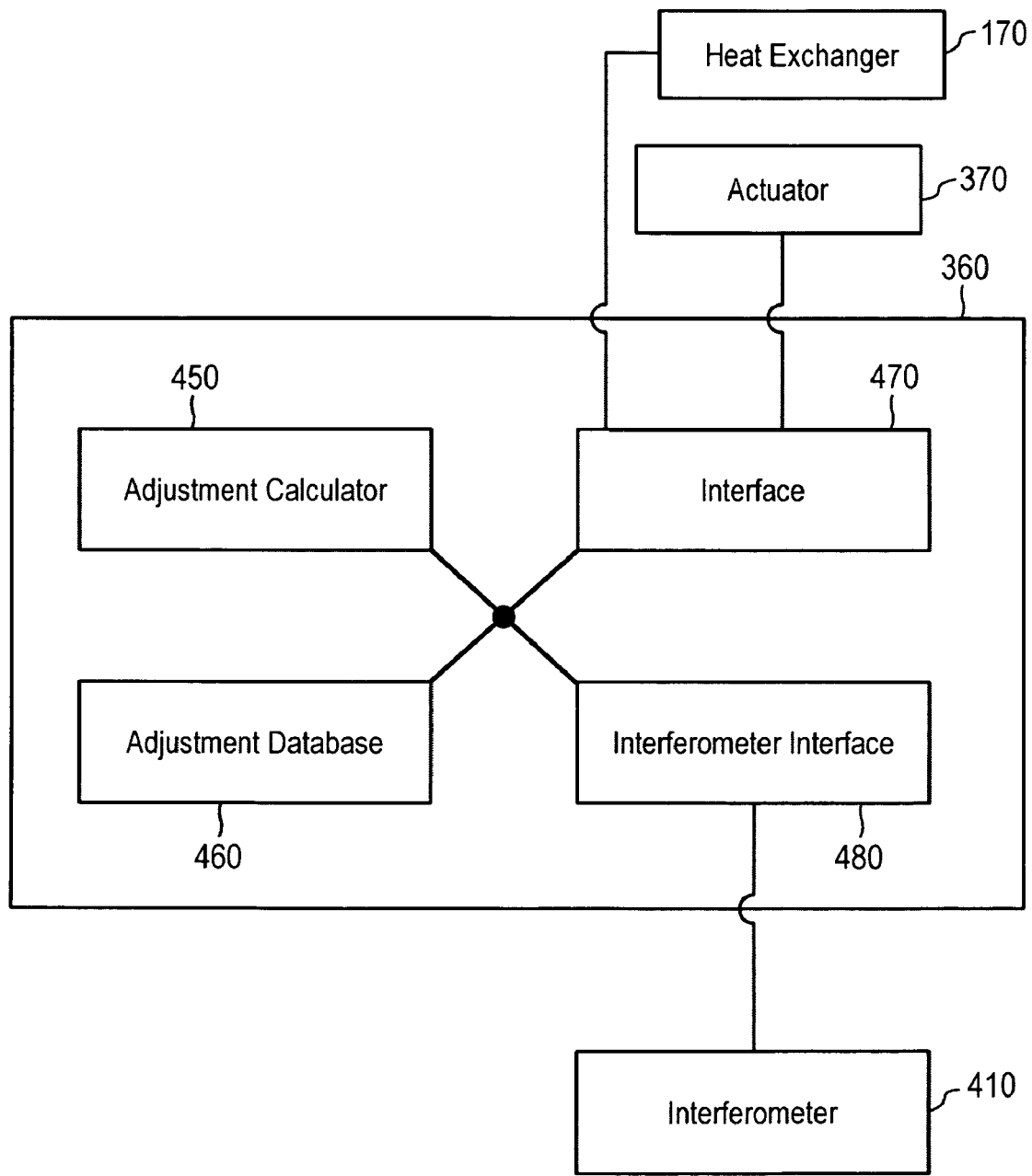
FIG. 4B is a block diagram of an exemplary immersion fluid heating compensation circuit.

FIG. 4B is a block diagram of the fluid heating compensation circuit 360 according to one embodiment of the present invention. In this embodiment, the fluid heating compensation circuit 360 includes an adjustment calculator 450, an adjustment database 460, an interface 470, and an interferometer interface 480. Additionally, or alternatively, the fluid heating compensation circuit 360 may not include the adjustment database 460 and/or the interferometer interface 480. The adjustment calculator 450 calculates the actuator adjustment settings based on the immersion fluid 160 characteristics, the exposure dose, the flow rate of the immersion fluid 160 and a reticle pattern image. The actuator adjustment settings are provided to the interface 470 to be transmitted to an optional actuator 370 to adjust one or more of the optical elements 210, 380, 390 of the lithography apparatus 100. The interface 470 may transmit the actuator adjustment settings to the optional heat exchanger 170 to adjust the temperature of the immersion fluid 160.

The adjustment database 460 may include actuator adjustment settings based on estimated effects of the exposure dose, the flow rate of the immersion fluid 160, and the reticle pattern image, as well as the characteristics of the immersion fluid. The adjustment database 460 allows actuator settings to be determined through a lookup table, rather than having a need to conduct a calculation.

In an embodiment, the interferometer interface 480 provides an interface to the interferometric sensor 410, such as the interferometric temperature detection system 300. The interferometric sensor 410 may be used to generate a set of sensitivity coefficients representative for aberration effects produced for various operating conditions (e.g., varying flow rate, varying exposure dose), prior to actual processing of a substrate. A set of actuator settings may then be determined for each of the conditions, which may be stored in the adjustment database 460. During actual operation when a set of operating conditions are observed that match a set of operating conditions in the adjustment database 460, the actuator settings associated with the set of operating conditions may be retrieved and provided to the actuator 370 and/or the optional heat exchanger 170 to correct for the aberration. Aberration adjustments may include, but are not limited to, focus tilt adjustments, spherical aberration tilt adjustments, and coma aberration adjustments.

In an embodiment, an aberration control system uses known or estimated values for these parameters to set up the aberration adjustment of the projection system PL. These adjustments compensate for any aberrations induced by the immersion fluid 160 heating during exposure. Between exposures, the aberration adjustments may be changed, but are not necessarily changed. In an embodiment, aberration adjustments are changed only if the flow rate of the immersion fluid 160 changes or the required exposure dose or reticle pattern image changes.

An aberration adjustment may be made to focus tilt (i.e., a substantially linearly varying field dependent best focus position), spherical aberration tilt (i.e., a substantially linearly varying field dependent value of spherical aberration), and to a coma aberration. In an embodiment, a dependence of one or more aberrations on exposure dose and fluid flow rate may be calibrated by measuring the one or more aberrations with the interferometric sensor 410 and observing the effects of exposure dose and fluid flow.

Figure 5:
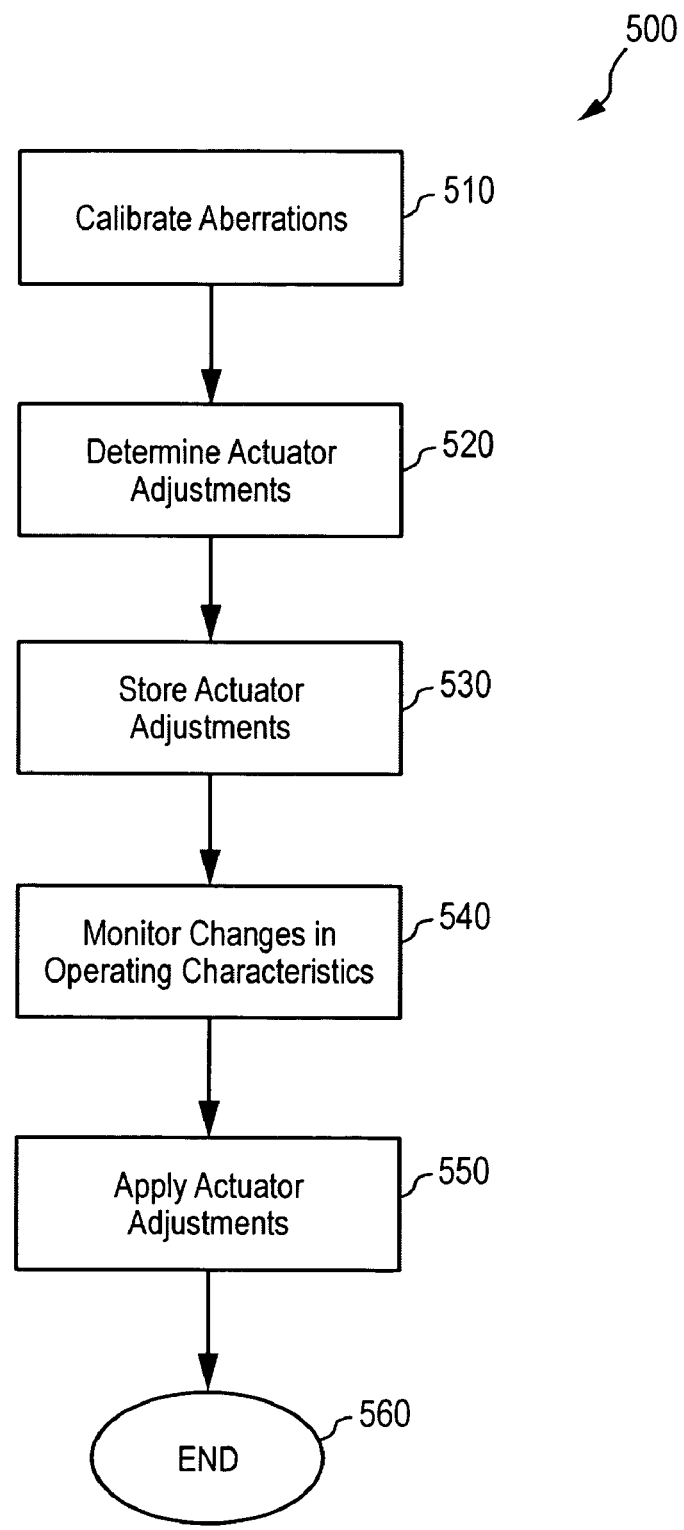
FIG. 5 is a flowchart of an exemplary method for compensating for a heating effect of exposure energy in immersion fluid.

FIG. 5 is a flowchart of a method 500 for compensating for a heating effect of exposure energy in an immersion fluid across an exposure zone of a lithography apparatus using pre-calibrated aberration information. For example, method 500 can be implemented using one or more of the systems described herein.

The method 500 begins in step 510. In the step 510, aberrations are calibrated based on sets of operating characteristics. For example, flow rate and exposure dose may be varied to generate different aberrations within the lithography apparatus 100. An interferometric sensor, such as the interferometric temperature detection system 300, that is coupled to the fluid heating compensation circuit 360 calibrates aberration effects and provides this information to the fluid heating compensation circuit 360.

In step 520, actuator adjustment settings are determined. For example, the adjustment calculator 450 may determine actuator adjustments needed to compensate for the aberrations.

In step 530, actuator adjustment settings are stored. For example, actuator adjustment settings are stored in the adjustment database 460. The settings are associated with the particular set of operating characteristics (e.g., flow rate and exposure dose).

In step 540, changes in operating characteristics are monitored. For example, the fluid heating compensation circuit 360 monitors changes in the operating characteristics of the lithography apparatus 100.

In step 550, when an operating characteristic changes, actuator adjustments that correspond to a changed operating characteristic are applied. For example, the adjustments can be done so that compensation for the heating effect of exposure energy of the immersion fluid 160 is made.

In step 560, the method 500 ends.

Figure 6A:
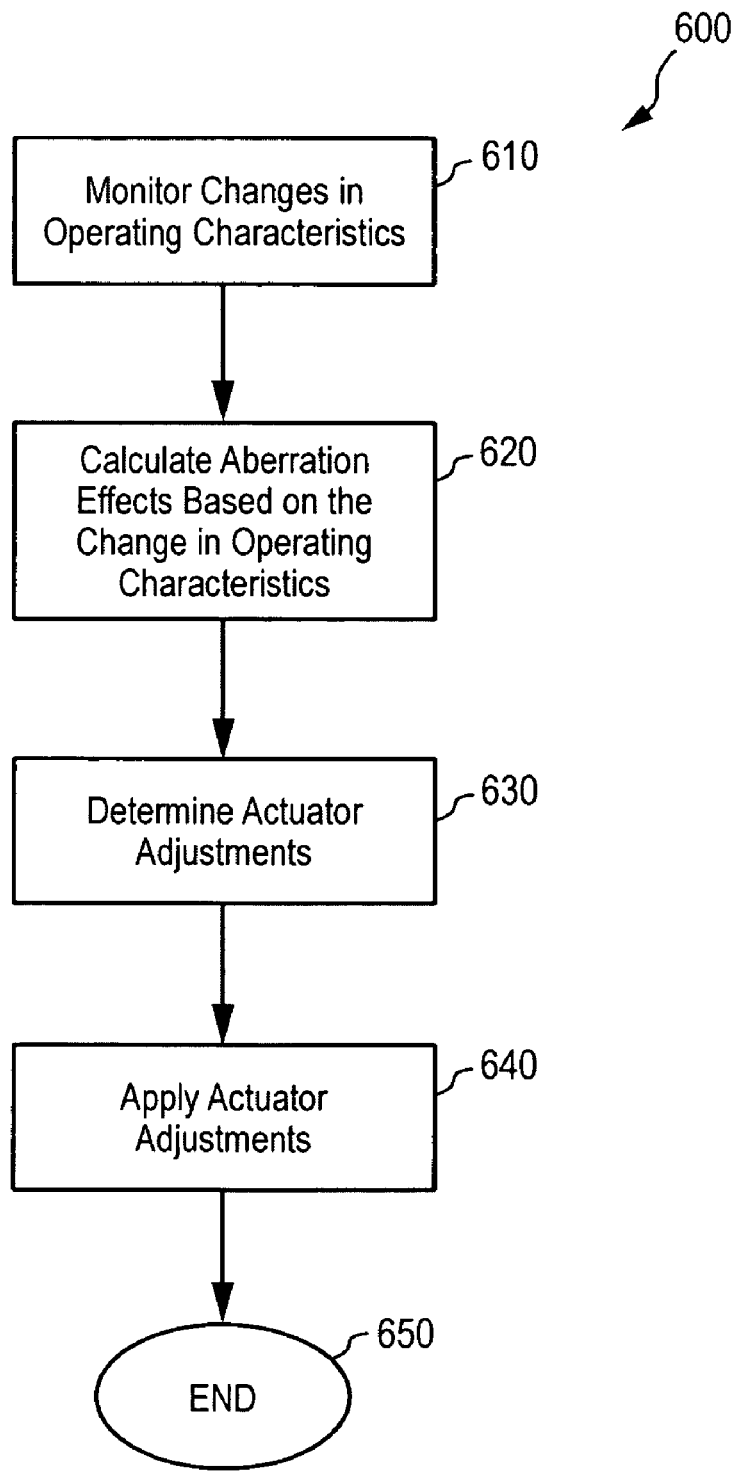
FIG. 6A is a flowchart of another exemplary method for compensating for a heating effect of exposure energy in immersion fluid.

FIG. 6A is a flowchart of method 600 for compensating for a heating effect of exposure energy in an immersion fluid across an exposure zone of a lithography apparatus using real-time calculated aberration information. In one example, method 600 can be implemented using one or more of the systems described herein.

In step 610, changes in operating characteristics are monitored. For example, the fluid heating compensation circuit 360 monitors changes in the operating characteristics of the lithography apparatus 100.

In step 620, aberration effects are calculated based on the new operating characteristics. For example, the adjustment calculator 450 determines potential aberrations based on the operating characteristics and resident information regarding the immersion fluid characteristics.

In step 630, actuator adjustment settings are determined. For example, the adjustment calculator 450 determines actuator adjustments needed to compensate for the aberrations estimated in the step 620. In an embodiment, the adjustment database 460 may be accessed to retrieve actuator adjustments corresponding to the changed operating characteristics.

In step 640, the actuator adjustments are applied, for example so that compensation for the heating effect of exposure energy of the immersion fluid 160 is made.

In step 650, the method 600 ends.

Figure 6B:
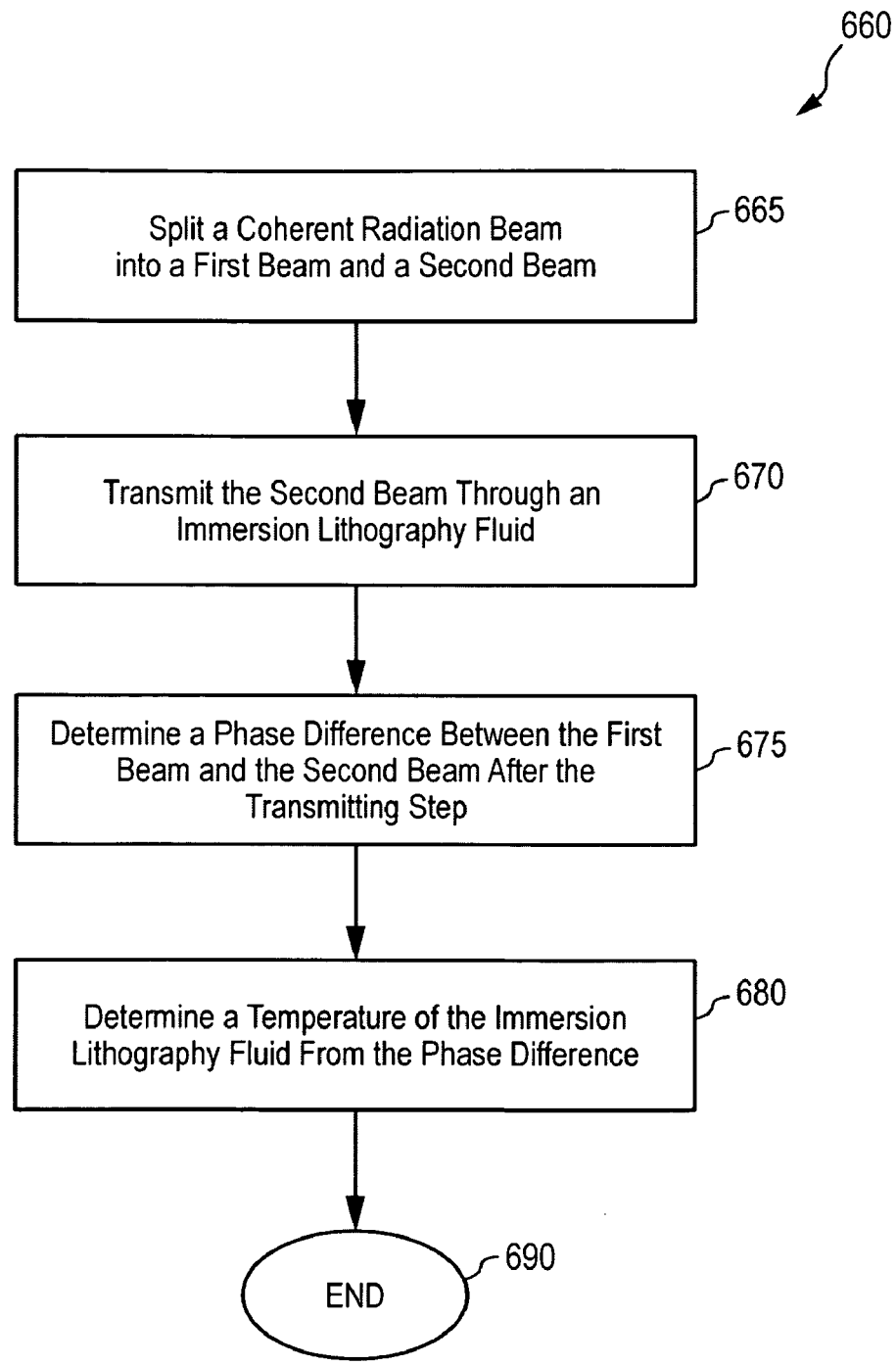
FIG. 6B is a flowchart of an exemplary method for measuring a temperature of an immersion fluid with an interferometer.

FIG. 6B is a flowchart of method 660 for measuring a temperature of an immersion fluid with an interferometer, for example the interferometric temperature detection system 300. In one example, method 660 can be implemented using one or more of the systems described above. In step 665, a coherent radiation beam is split into a first beam and a second beam. In step 670, the second beam is transmitted through an immersion fluid, such as the immersion fluid 160. In step 675, a phase difference is determined between the first beam and the second beam after the transmitting step. The phase difference determination may include detecting the first beam and/or detecting the second beam. The first beam may have a polarization state different from that of the second beam. In step 680, a temperature of the immersion fluid is determined from the phase difference. In step 690, the method 660 ends.

Additionally, or alternatively, the method 660 may also include additional steps. In an optional step, the first beam may be polarized to and from a reflection of the first beam from a reflecting element. In another optional step, the second beam of radiation may be polarized to and from a reflection of the second beam from a reflecting element, where reflection occurs after the second beam of radiation has transmitted through the immersion fluid. In another optional step, the second beam of radiation may be polarized to and from a reflection of the second beam from a reflecting element, where reflection occurs before the second beam of radiation has transmitted through the immersion fluid.

The method 660 may comprise a step for transferring energy to the immersion fluid based on the temperature of the immersion fluid to change the temperature of the immersion fluid. The energy transfer substantially reduces and/or substantially eliminates any image aberration caused by a change in the immersion fluid temperature during exposure of a substrate in immersion lithography. The method 660 may comprise a step transferring energy from the immersion fluid based on the temperature of the immersion fluid to change the temperature of the immersion fluid. The energy transfer substantially reduces and/or substantially eliminates any image aberration caused by a change in the immersion fluid temperature during exposure of a substrate in immersion lithography.

Figure 7:
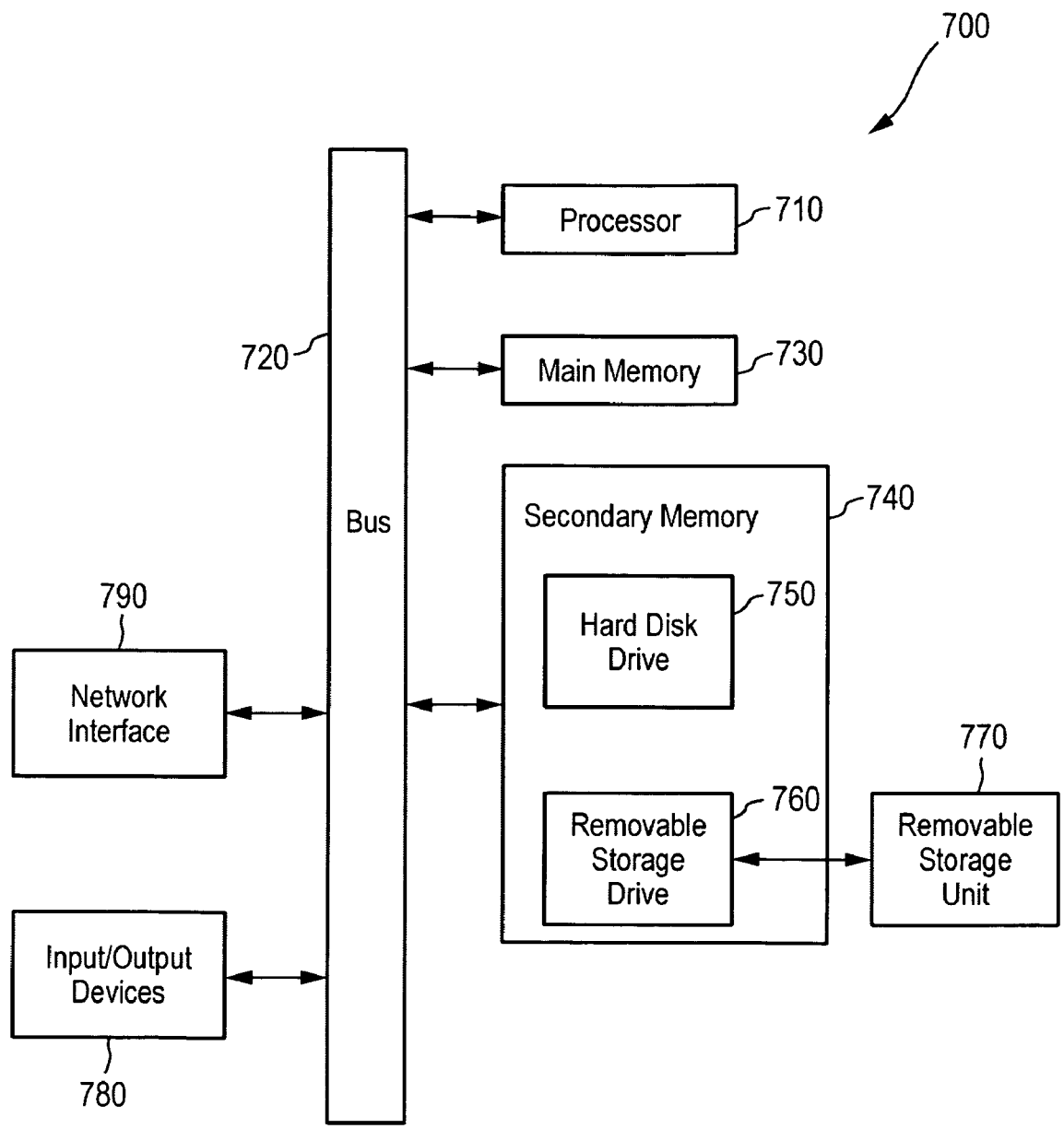
FIG. 7 illustrates an exemplary embodiment in which at least part of the methods and/or systems described herein are implemented using a computer.

FIG. 7 illustrates an exemplary embodiment in which at least parts of the methods and/or systems described herein are implemented using a computer 700. For example, all or portions of the fluid heating compensation circuit 360 may be implemented using the computer 700. In another example, at least a part of the methods 500, 600, 660 described herein may be performed by the computer 700.

The computer 700 includes one or more processors (also called central processing units, or CPUs), such as processor 710. The processor 710 is connected to a communication bus 720. The computer 700 also includes a main or primary memory 730, preferably random access memory (RAM). The primary memory 730 may have stored therein control logic (computer software).

The computer 700 may also include one or more secondary storage devices 740. The secondary storage devices 740 include, for example, a hard disk drive 750 and/or a removable storage device or drive 760. The removable storage drive 760 represents, for example, a floppy disk drive, a magnetic tape drive, a compact disk drive, an optical storage device, and/or a tape backup.

A removable storage drive 760 may interact with a removable storage unit 770. The removable storage unit 760 includes a computer usable or readable storage medium having stored therein computer software (control logic).

The removable storage unit 770, also called a program storage device or a computer program product, represents a floppy disk, magnetic tape, compact disk, optical storage disk, or any other computer data storage device. Program storage devices or computer program products also include any device in which computer programs may be stored, such as hard drives, ROM or memory cards, etc.

An embodiment of the present invention is directed to computer program products or program storage devices having software that enables the computer 700 to perform any combination of the functions described herein.

A computer program (also called computer control logic) is stored in the main memory 730 and/or the secondary storage device 740. Such computer programs, when executed, direct the computer 700 to perform the functions as discussed herein. In particular, the computer programs, when executed, enable the processor 710 to perform the functions. Accordingly, such computer programs represent controllers of the computer 700. For example, where applicable, at least a part of the methods described herein may take the form of a computer program containing one or more sequences of machine-readable instructions describing a method as disclosed herein, or a data storage medium (e.g. semiconductor memory, magnetic or optical disk) having such a computer program stored therein.

The computer 700 may also include an input/output/display device 780, such as monitors, keyboards, pointing devices, etc. In an example, the interferometric temperature detection system 300 is an input device that is coupled to the communication bus 720. The controller 420 may also be coupled to the communication bus 720, as may the fluid heating compensation circuit 360.

The computer 700 may further include a communication and/or network interface 790. The network interface 790 enables the computer 700 to communicate with remote devices. For example, the network interface 790 allows the computer 700 to communicate over a communication network, such as a LAN, a WAN, the Internet, etc. The network interface 790 may interface with a remote site or network via a wired or a wireless connection. The computer 700 receives data and/or computer programs via the network interface 790. The electrical/magnetic signals having contained therein data and/or computer programs received or transmitted by the computer 700 via the network interface 790 may also represent a computer program product. Any software, hardware, and operating system implementation suitable for performing the functions described herein may be used.

While various embodiments have been described herein, it should be understood that they have been presented by way of example only, and not limitation. It will be apparent to persons skilled in the relevant art that various changes in form and detail may be made therein without departing from the spirit and scope of the invention. Thus, the breadth and scope should not be limited by any of the exemplary embodiments described herein, but should be defined only in accordance with the following claims and their equivalents.

It is to be appreciated that the Detailed Description section, and not the Summary and Abstract sections, is intended to be used to interpret the claims. The Summary and Abstract sections may set forth one or more, but not all exemplary embodiments as contemplated by the inventor(s), and thus, are not intended to limit the present invention and the appended claims in any way.

What is claimed is:

1. A system, comprising:
   an immersion lithography exposure system having a movable substrate table configured to hold a radiation-sensitive substrate and a projection system configured to project a patterned beam of radiation onto the radiation-sensitive substrate;
   an immersion fluid system configured to provide immersion fluid to a space between the projection system and the substrate table; and
   an interferometric temperature detection system configured to measure a temperature of the immersion fluid in the space, the interferometric temperature detection system configured to reflect a measuring beam off a reflective surface in the space.

2. The system of claim 1, wherein the interferometric temperature detection system further comprises:
   a beamsplitter;
   a first polarizing element;
   an immersion fluid receptacle, having the reflective surface, that is configured to guide the immersion fluid;
   a second polarizing element;
   a reflective element; and
   a detector;
   wherein, in use:
   a first polarization state of a beam of radiation transmits through the beamsplitter and the first polarizing element to reflect from the reflective element back through the first polarizing element and the beamsplitter, and is received by the detector, and
   a second polarization state of the beam of radiation transmits through the beamsplitter, the second polarizing element, and the immersion fluid to reflect from the reflective portion of the immersion fluid receptacle back through the second polarizing element and the beamsplitter, and is received by the detector.

3. The system of claim 2, wherein the first polarizing element is a quarter-wave plate or a three-quarter-wave plate.

4. The system of claim 2, wherein the second polarizing element is a quarter-wave plate or a three-quarter-wave plate.

5. The system of claim 2, wherein the detector is coupled to an apparatus configured to adjust energy of the immersion fluid.

6. The system of claim 2, wherein the detector is coupled to a peltier device.

7. The system of claim 2, further comprising a radiation source configured to produce the beam of radiation having a non-actinic wavelength.

8. The system of claim 2, wherein the detector is coupled to an apparatus configured to adjust a position of an optical element in the immersion lithography exposure system.

9. The system of claim 8, wherein an adjustment of the optical element is controlled based on a signal from the detector, such that an image aberration in the immersion lithography exposure system caused by a change in the temperature of the immersion fluid is substantially eliminated.

10. The system of claim 8, wherein the apparatus is a focus controller.

11. The system of claim 2, wherein the detector is coupled to a control circuit configured to control heat exchange with respect to the immersion fluid.

12. The system of claim 11, wherein a change in temperature of the immersion fluid is controlled based on a signal from the detector, such that an image aberration in the immersion lithography exposure system caused by a change in the temperature of the immersion fluid is substantially eliminated.

13. The system of claim 1, wherein the interferometric temperature detection system includes a shearing interferometer to measure the temperature of the immersion fluid.

14. A method, comprising:
   splitting a radiation beam into a first beam and a second beam;
   transmitting the second beam through an immersion fluid in a space between a movable substrate table holding a radiation-sensitive substrate and a projection system configured to project a patterned beam of radiation, through the immersion fluid, onto the radiation-sensitive substrate;
   reflecting the second beam off a reflective surface in the space;
   determining a phase difference between the first beam and the second beam after the transmitting and reflecting; and
   determining a temperature of the immersion fluid from the phase difference.

15. The method of claim 14, further comprising, before determining the phase difference, polarizing the first beam to and from a reflection of the first beam from a reflecting element.

16. The method of claim 14, further comprising, before determining the phase difference, polarizing the second beam to and from a reflection of the second beam from the reflective surface, where the reflection occurs after the second beam of radiation has transmitted through immersion fluid.

17. The method of claim 14, further comprising polarizing the second beam to and from a reflection of the second beam from the reflective surface, a reflection occurs from a further reflective surface before the second beam has transmitted through immersion fluid.

18. The method of claim 14, wherein the second beam has a polarization state different from that of the first beam.

19. The method of claim 14, further comprising adjusting energy of the immersion fluid based on the determined temperature of the immersion fluid to change the temperature of the immersion fluid.

20. The method of claim 19, wherein the energy transfer substantially eliminates an image aberration caused by a change in the immersion fluid temperature during an exposure operation while a substrate is interacting with the immersion fluid.

* * * * *